United States Patent [19]

Hara

[11] Patent Number: 5,175,513
[45] Date of Patent: Dec. 29, 1992

[54] OSCILLATOR CIRCUIT EMPLOYING INDUCTIVE CIRCUIT FORMED OF FIELD EFFECT TRANSISTORS

[75] Inventor: Shinji Hara, Nara, Japan

[73] Assignee: Sharp Kabushiki Kaisha, Osaka, Japan

[21] Appl. No.: 849,463

[22] Filed: Mar. 11, 1992

[30] Foreign Application Priority Data

Mar. 13, 1991 [JP] Japan ................................. 3-48134

[51] Int. Cl.⁵ ........................ H03B 5/24; H03H 11/10
[52] U.S. Cl. ............................ 331/115; 331/117 FE; 333/214
[58] Field of Search ............. 331/115, 117 FE, 117 R; 333/213, 214, 215, 216, 217

[56] References Cited

U.S. PATENT DOCUMENTS 3,255,364  6/1966  Warner, Jr. .................. 333/215 X
3,715,693  2/1973  Fletcher et al. ................ 333/215
4,812,785  3/1989  Pauker ...................... 331/117 FE
4,873,497  10/1989  Kielmeyer, Jr. ................ 331/108 B

FOREIGN PATENT DOCUMENTS 2-205107  8/1990  Japan.

Primary Examiner—Siegfried H. Grimm
Attorney, Agent, or Firm—Nixon & Vanderhye

[57] ABSTRACT

A cascode amplifier having a 180° phase characteristic is connected with in-phase feedback circuits having a 0° phase characteristics. When viewed from an output side of the cascode amplifier, these circuits operate as inductive circuits having negative resistance. Thus, connecting a capacitor to the output of the cascode amplifier causes formation of a parallel resonance circuit, so that an oscillating operation is carried out. Since an inductor, i.e., inductive circuit can be structured without use of a transmission line, an occupied region necessary for formation of a microwave oscillation circuit is reduced.

13 Claims, 2 Drawing Sheets 5,175,513

1

OSCILLATOR CIRCUIT EMPLOYING INDUCTIVE CIRCUIT FORMED OF FIELD EFFECT TRANSISTORS

BACKGROUND OF THE INVENTION

1. Field of the Invention

The present invention relates generally to oscillator circuits and, more particularly, to an oscillator circuit using an inductive circuit formed of field effect transistors. The invention has a particular applicability to microwave oscillator circuits using metal semiconductor field effect transistors (MESFETs).

2. Description of the Background Art

In recent years, various small electronic apparatuses utilizing a microwave signal have been developed and supplied for commercial use. Such electronic apparatus includes in general an oscillator having an oscillation frequency of a microwave band, i.e., a microwave oscillation circuit. Recently, with advancement in down-sizing of electronic apparatus, it is desirable that an occupied area of a microwave oscillation circuit on semiconductor substrate is reduced. The present invention is in general applicable to oscillator circuits using field effect transistors. A description will now be made on an example in which the present invention is applied to a microwave oscillation circuit employing metal semiconductor field effect transistors (hereinafter referred to as MESFETs).

FIG. 3 is an equivalent circuit diagram of a conventional microwave oscillation circuit. With reference to FIG. 3, this oscillation circuit includes a field effect transistor 70, an inductor 72 and a capacitor 73 both connected to a source (S) of transistor 70 through a transmission line 75, an output load resistor 74 connected to a drain (D) of transistor 70, and an inductor 71 connected to a gate (G) of transistor 70. Since transistor 70 has its gate grounded through inductor 71, a circuit having negative resistance in a desired frequency band can be structured when viewed from the source of transistor 70. Since inductor 72 and capacitor 73 together constitute a parallel resonance circuit, an oscillation circuit is formed by setting transmission line 75 under phase conditions satisfying oscillating conditions for negative resistance.

In a microwave band, it is very difficult to implement an inductor of a concentrated constant for forming such an oscillation circuit. Thus, inductance as a resonance element is normally constituted by using transmission line 75. The oscillation circuit of this type is widely used because of its simple structure; however, an increase in the size of the circuit is unavoidable because of usage of transmission line 75.

SUMMARY OF THE INVENTION

One object of the present invention is to reduce an occupied region necessary for formation of an oscillator circuit.

Another object of the present invention is to provide a down-sized microwave oscillator.

Briefly, an oscillator circuit in accordance with the present invention includes an inductive circuit having a negative resistance characteristic, and a capacitor for use along with the inductive circuit in formation of a parallel resonance circuit. The inductive circuit includes a first grounded source amplifier including a first field effect transistor having a grounded source, a grounded gate amplifier connected to an output of the grounded source amplifier and including a second field effect transistor having a grounded gate, and an in-phase feedback circuit for feeding an output signal of the grounded gate amplifier back in phase to the grounded source amplifier. The in-phase feedback circuit includes a second grounded source amplifier including a third field effect transistor having a grounded source, and a third grounded source amplifier connected to an output of the second grounded source amplifier and including a fourth field effect transistor having a grounded source.

In operation, since a parallel resonance circuit for formation of the oscillator circuit is formed of the inductive circuit using the field effect transistors and the capacitor, it is unnecessary to use a transmission line as an inductor. Accordingly, an occupied region necessary for formation of the oscillator circuit can be reduced.

According to another aspect of the present invention, the oscillator circuit includes an inductive circuit formed of field effect transistors, and a capacitor for formation of a parallel resonance circuit along with the inductive circuit. The inductive circuit includes an inversion amplifier, an impedance converter connected to an output of the inversion amplifier and having a higher output impedance, and an in-phase feedback circuit for feeding an output signal of the impedance converter back in phase to the inversion amplifier. The in-phase feedback circuit includes cascaded first and second grounded source amplifiers including field effect transistors each having grounded sources. The oscillator circuit further includes negative resistance characteristic applying means for applying a negative resistance characteristic to the inductive circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
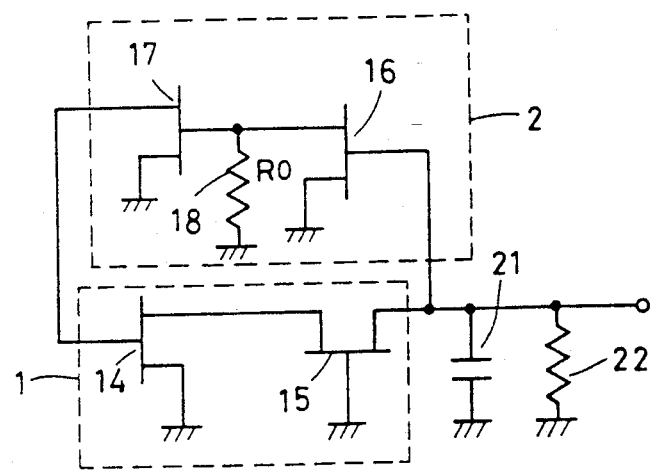
FIG. 1 is a circuit diagram of a microwave oscillation circuit showing one embodiment of the present invention.
Figure 2:
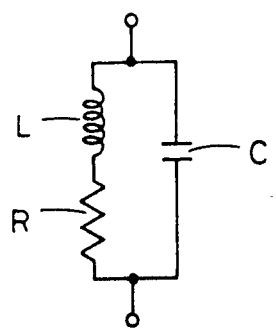
FIG. 2 is an equivalent circuit diagram of the circuit shown in FIG. 1.
Figure 3:
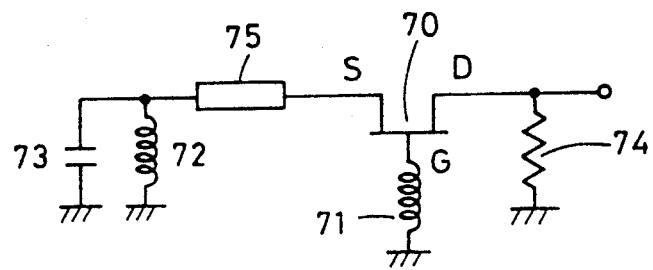
FIG. 3 is an equivalent circuit diagram of a conventional microwave oscillation circuit.

FIG. 1 is a circuit diagram of a microwave oscillation circuit showing one embodiment of the present invention. With reference to FIG. 1, this oscillation circuit includes a grounded source field effect transistor (MESFET) 14 and a grounded gate field effect transistor (MESFET) 15 constituting a cascode amplifier 1 having a 180° phase characteristic, grounded source field effect transistors (MESFET) 16 and 17 constituting an in-phase feedback circuit 2 for cascode amplifier 1, a capacitor 21 connected between an output of cascode amplifier 1 and ground, and an output load resistor 22. Transistor 14 having a grounded source constitutes an inversion amplifier. Transistor 15 having a grounded gate operates as an impedance converter. That is, this impedance converter has a higher output impedance. Each of transistors 16 and 17 constitutes an inversion amplifier. Accordingly, a signal having the same phase as that of an output signal of cascode amplifier 1 is allowed to be fedback to an input of cascode amplifier 1. In other words, in-phase feedback circuit 2 applies negative feedback to cascode amplifier 1. In order to simplify a description, assume that all field effect transistors 14, 15, 16 and 17 shown in FIG. 1 have the same circuit constant, i.e., each field effect transistor is equivalently expressed only by transconductance gm and gate-source capacitance Cgs and that a resistor 18 has a resistance value Ro. Thus, admittance Y across the gate and the drain of transistor 15 in the circuit shown in FIG. 1 is expressed by the following equation:

$$Y = j\omega Cgs + \frac{1}{j\omega Cgs} \cdot \frac{gm^2 Ro}{1 + j\omega CgsRo} \cdot \frac{gm^2}{gm + j\omega Cgs} \quad (1)$$

where $\omega$ indicates angular frequency, and j is purely imaginary number. Accordingly, the circuit shown in FIG. 1 is expressed equivalently as a parallel resonance circuit shown in FIG. 2. Inductance L, resistance R and capacitance C shown in FIG. 2 are obtained by the following equations, respectively:

$$L = Cgs/gm^2 Ro \quad (2)$$

$$R = -\omega^2 Cgs^2 (1 + gmRo)/gm^4 Ro \quad (3)$$

$$C = Cgs \quad (4)$$

As can be understood from the above equation (3), it is pointed out that circuits 1 and 2 constituted by transistors 14–17 and resistor 18 operate as an inductive circuit having negative resistance. In the circuit shown in FIG. 1, since this inductive circuit is connected with capacitor 21 and load resistor 22, the absolute value of which is so high as not to eliminate the negative resistance, oscillating condition is satisfied.

Figure 4:
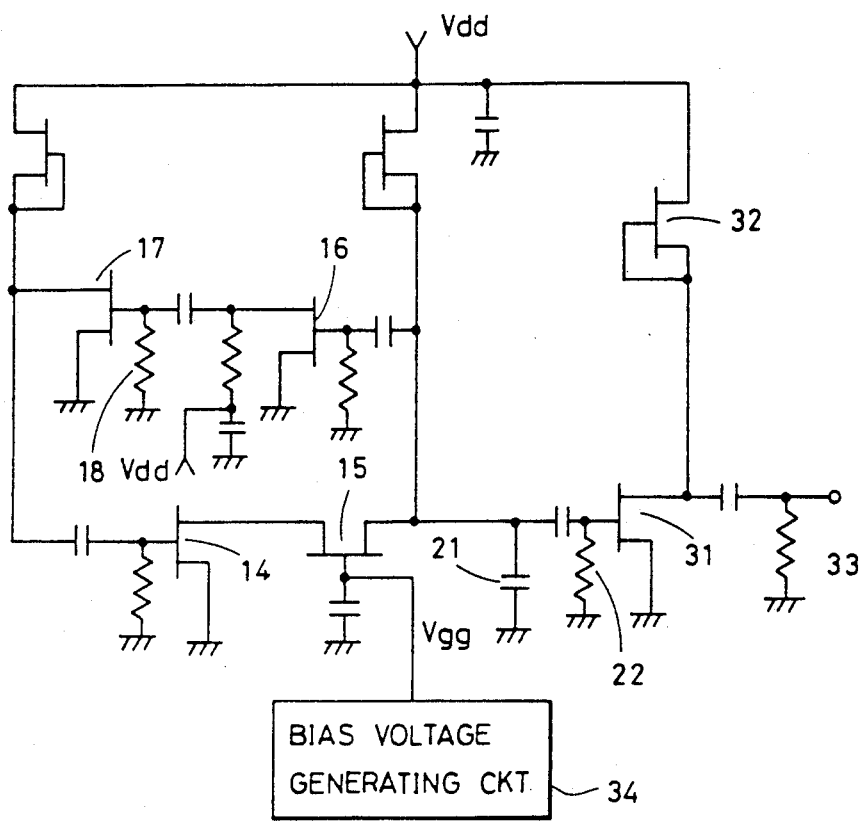
FIG. 4 is an actual circuit diagram for use in implementing the circuit of FIG. 1.

FIG. 4 is an actual circuit diagram for use in implementing the circuit of FIG. 1. With reference to FIG. 4, circuit elements corresponding to those of FIG. 1 are denoted with identical reference numerals. In this circuit, a supply voltage Vdd is applied, and a controllable bias voltage Vgg is applied from a circuit 34. In a microwave band, load resistance is normally 50Ω, and if a resistance element of 50Ω is used as load resistance, oscillating condition is not satisfied. Accordingly, in the circuit shown in FIG. 4, a buffer amplifier formed of field effect transistors 31 and 32 is provided in an output stage of the oscillation circuit, and a load resistor 33 of 50Ω is connected through this buffer amplifier.

Figure 5:
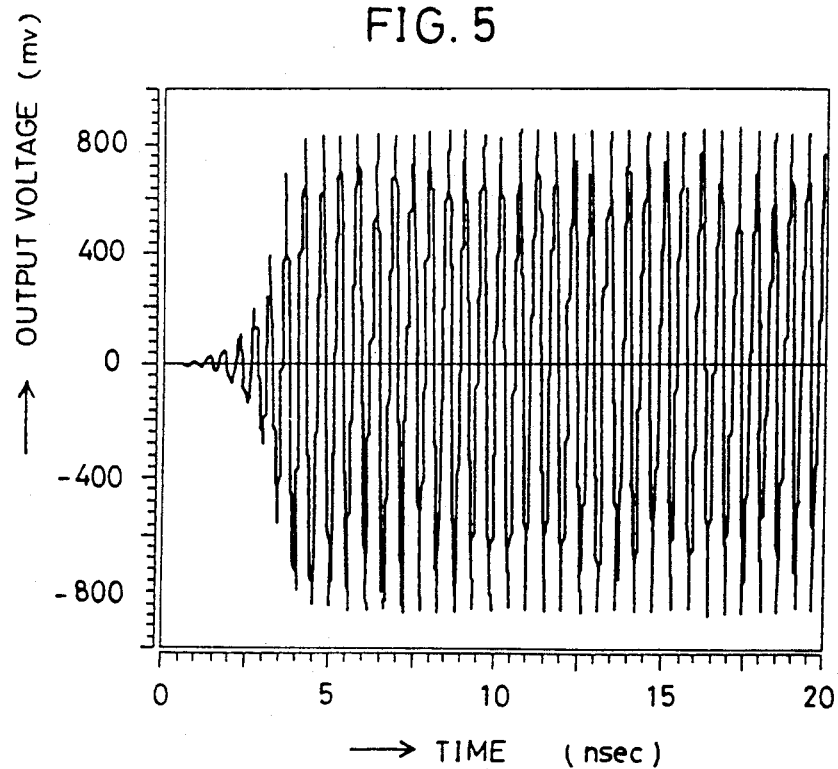
FIG. 5 is an oscillation waveform diagram showing the result of SPICE simulation carried out for the circuit shown in FIG. 4.

FIG. 5 is an oscillation waveform diagram showing the result of SPICE simulation carried out for the circuit of FIG. 4. Referring to FIG. 5, the longitudinal axis indicates an output voltage (mV), and the lateral axis indicates an elapse of time (nsec). An oscillation waveform shown in FIG. 5 is obtained in the oscillation circuit shown in FIG. 4.

It is pointed out that in the oscillation circuit of FIG. 4, control over bias voltage Vgg enables control over inductance values of an equivalently structured inductive circuit and hence implementation of a variable oscillation circuit having a controllable oscillation frequency.

As described above, in the oscillation circuit shown in FIG. 1, cascode amplifier 1 having a 180° phase-shift characteristic is constituted by transistors 14 and 15, and feedback circuit 2 having a 0° phase-shift characteristic is connected in parallel with cascode amplifier 1, whereby an inductive circuit having negative resistance, i.e., an inductor can equivalently be configured. Accordingly, an oscillation circuit that oscillates at a resonance frequency determined by the equivalent inductor and capacitor 21 can be implemented without use of a transmission line. In other words, since a microwave oscillation circuit can be structured without need for an inductor due to a transmission line, a down-sized oscillator can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillator circuit, comprising:
   an inductive circuit having a negative resistance characteristic; and
   capacitance means for forming a parallel resonance circuit along with said inductive circuit, wherein
   said inductive circuit includes
      first grounded source amplifier means including a first field effect transistor having a grounded source,
      grounded gate amplifier means connected to an output of said grounded source amplifier means and including a second field effect transistor having a grounded gate, and
      in-phase feedback means for feeding an output signal of said grounded gate amplifier means back in phase to said grounded source amplifier means,
      said in-phase feedback means including cascaded second and third grounded source amplifier means each including a field effect transistor having a grounded source.

2. The oscillator circuit according to claim 1, further comprising
   negative resistance characteristic applying means for applying said negative resistance characteristic to said inductive circuit.

3. The oscillator circuit according to claim 2, wherein said negative resistance characteristic applying means includes resistance means connected to said inductive circuit and having a resistance value selected to apply said negative resistance characteristic to said inductive circuit.

4. The oscillator circuit according to claim 2, wherein said negative resistance characteristic applying means includes
   load means for receiving an oscillation signal generated from said oscillator circuit, and
   buffer amplifier means connected between said inductive circuit and said load means,
   said buffer amplifier means applying said negative resistance characteristic to said inductive circuit.

5. The oscillator circuit according to claim 1, wherein said in-phase feedback means includes
   second grounded source amplifier means including a third field effect transistor having a grounded source, and third grounded source amplifier means connected to an output of said second grounded source amplifier means and including a fourth field effect transistor having a grounded source.

6. The oscillator circuit according to claim 1, further comprising
oscillation frequency control means for controlling an oscillation frequency of said oscillator circuit.

7. The oscillator circuit according to claim 6, wherein said oscillation frequency control means includes means for applying a controllable bias voltage to a gate of said second field effect transistor.

8. The oscillator circuit according to claim 1, wherein said first grounded source amplifier means and said grounded gate amplifier means constitute a cascode amplifier.

9. The oscillator circuit according to claim 5, wherein said first, second, third and fourth field effect transistors comprise first, second, third and fourth metal semiconductor field effect transistors, respectively.

10. The oscillator circuit according to claim 9, wherein
each of said first, second, third and fourth metal semiconductor field effect transistors has the same circuit constant.

11. The oscillator circuit according to claim 1, wherein
said parallel resonance circuit has a resonance frequency of a microwave band.

12. An oscillator circuit, comprising:
an inductive circuit formed of field effect transistors; and
capacitance means for forming a parallel resonance circuit along with said inductive circuit, wherein said inductive circuit includes
inversion amplifier means,
impedance conversion means connected to an output of said inversion amplifier means and having a higher output impedance, and
in-phase feedback means for feeding an output signal of said impedance conversion means back in phase to said inversion amplifier means,
said in-phase feedback means including cascaded first and second grounded source amplifier means each including a field effect transistor having a grounded source,
said oscillator circuit further comprising negative resistance characteristic applying means for applying a negative resistance characteristic to said inductive circuit.

13. The oscillator circuit according to claim 12, wherein
said inversion amplifier means comprises third grounded source amplifier means including a field effect transistor having a grounded source, and
said impedance conversion means comprises grounded gate amplifier means including a field effect transistor having a grounded gate.

* * * * *